(12) United States Patent
Kang

(10) Patent No.: US 10,181,444 B2
(45) Date of Patent: Jan. 15, 2019

(54) ELECTRONIC DEVICE AND METHOD FOR FABRICATING THE SAME

(71) Applicant: SK hynix Inc., Icheon (KR)

(72) Inventor: Hyun-Seok Kang, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/789,739

(22) Filed: Oct. 20, 2017

(65) Prior Publication Data

US 2018/0254248 A1 Sep. 6, 2018

(30) Foreign Application Priority Data

Mar. 3, 2017 (KR) ........................ 10-2017-0027608

(51) Int. Cl.
| | |
|---|---|
| *H01L 23/552* | (2006.01) |
| *H01L 43/08* | (2006.01) |
| *H01L 23/528* | (2006.01) |
| *H01L 27/22* | (2006.01) |
| *H01L 27/24* | (2006.01) |
| *H01L 27/11507* | (2017.01) |
| *H01L 43/02* | (2006.01) |
| *H01L 43/12* | (2006.01) |
| *H01L 45/00* | (2006.01) |
| *G06F 12/0868* | (2016.01) |
| *H01L 23/522* | (2006.01) |

(52) U.S. Cl.
CPC ........ *H01L 23/552* (2013.01); *G06F 12/0868* (2013.01); *H01L 23/528* (2013.01); *H01L 23/5226* (2013.01); *H01L 27/11507* (2013.01); *H01L 27/224* (2013.01); *H01L 27/2418* (2013.01); *H01L 27/2427* (2013.01); *H01L 43/02* (2013.01); *H01L 43/08* (2013.01); *H01L 43/12* (2013.01); *H01L 45/06* (2013.01); *H01L 45/08* (2013.01); *H01L 45/1233* (2013.01); *H01L 45/1253* (2013.01); *H01L 45/16* (2013.01); *G06F 2212/225* (2013.01); *G06F 2212/6042* (2013.01)

(58) Field of Classification Search
CPC ... H01L 23/5225; H01L 23/552; H01L 43/02; H01L 43/08; H01L 43/12; H01L 2225/06537

See application file for complete search history.

(56) References Cited

U.S. PATENT DOCUMENTS

| | | | |
|---|---|---|---|
| 8,664,010 B2 * | 3/2014 | Matsubara | ............ H01L 27/228 257/422 |
| 2002/0070396 A1 | 6/2002 | Nakajima | |

(Continued)

FOREIGN PATENT DOCUMENTS

KR 10-1999-0078452 A 10/1999

*Primary Examiner* — Allison P Bernstein

(57) ABSTRACT

An electronic device includes a semiconductor memory, wherein the semiconductor memory may include: a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma.

20 Claims, 9 Drawing Sheets

(56) References Cited

U.S. PATENT DOCUMENTS

2007/0253245 A1* 11/2007 Ranjan .................... G11C 11/16
365/171
2014/0258626 A1* 9/2014 Kang .................. H01L 45/1253
711/125

* cited by examiner

ELECTRONIC DEVICE AND METHOD FOR FABRICATING THE SAME

CROSS-REFERENCE TO RELATED APPLICATIONS

The present application claims priority to Korean Patent Application No. 10-2017-0027608, filed on Mar. 3, 2017, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits and devices, as well as their applications in electronic devices and systems. The disclosed technology also includes various implementations of an electronic device and a method for fabricating the same. The electronic device may include a semiconductor memory that can prevent deterioration of characteristics of a memory cell.

In an implementation, an electronic device may include a semiconductor memory, wherein the semiconductor memory may include: a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma.

Implementations of the above device may include one or more the following.

The shielding layer is entirely surrounded by the insulating layer. The shielding layer is electrically isolated from the cell mat and the conductive pattern. The shielding layer includes a metal, a metal nitride, or both. The shielding layer and the conductive pattern include the same material. The electronic device further comprises a protective layer disposed over the semiconductor memory. The shielding layer has substantially the same planar area as the cell mat. The shielding layer has substantially the same planar area as the second portion of the cell mat. The semiconductor memory further comprises: a contact plug disposed under the conductive pattern, the contact plug connecting the conductive pattern with the substrate, wherein the contact plug is located outside of the cell mat. The shielding layer is electrically insulated from the contact plug. The cell mat further includes: a plurality of first lines located under the memory cells, the plurality of first lines extending in a first direction; and a plurality of second lines located over the memory cells, the plurality of second lines extending in a second direction crossing the first direction, and wherein the memory cells are located at intersections between the first lines and the second lines. Each of the memory cells includes a variable resistance layer, a resistance of the variable resistance layer switching between different resistance states according to a voltage or current applied through the first lines and the second lines.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another implementation, a method for fabricating an electronic device including a semiconductor memory may include: forming a cell mat over a substrate, the cell mat including a plurality of memory cells; forming a shielding layer over the cell mat, the shielding layer being spaced apart from the cell mat; and forming a conductive pattern over the shielding layer, the conductive pattern being spaced apart from the shielding layer and overlapping a first portion of the cell mat without overlapping a second portion of the cell mat, wherein the shielding layer overlaps at least the second portion of the cell mat and is capable of blocking plasma.

Implementations of the above method may include one or more the following.

The shielding layer is entirely surrounded by an insulating layer. Forming the shielding layer includes: forming a first insulating layer over the cell mat; forming a recess in the first insulating layer without exposing the cell mat by selectively etching the first insulating layer; filling the recess with a material layer, the material layer being the shielding layer; and forming a second insulating layer over the material layer and the first insulating layer. Forming the shielding layer includes: forming a first insulating layer over the cell mat; forming a material layer over the first insulating layer; forming the shielding layer by selectively etching the material layer; and forming a second insulating layer covering a top surface of the etched material layer and a side surface of the etched material layer. The method further comprises: performing a passivation process after the conductive pattern is formed, wherein the passivation process includes exposing the electronic device to plasma. The shielding layer includes a metal, a metal nitride, or both. The shielding layer and the conductive pattern include the same material. The shielding layer has substantially the same planar area as the cell mat. The shielding layer has substantially the same planar area as the second portion of the cell mat. The method further comprises: forming a contact plug coupled to the substrate before the conductive pattern is formed, wherein the conductive pattern is formed over the contact plug, the contact plug coupling the conductive pattern with the substrate, and wherein the contact plug is located outside of the cell mat. The shielding layer is electrically insulated from the contact plug.

These and other aspects, implementations and associated advantages are described in greater detail in the drawings, the description and the claims.

DETAILED DESCRIPTION

Figure 1:
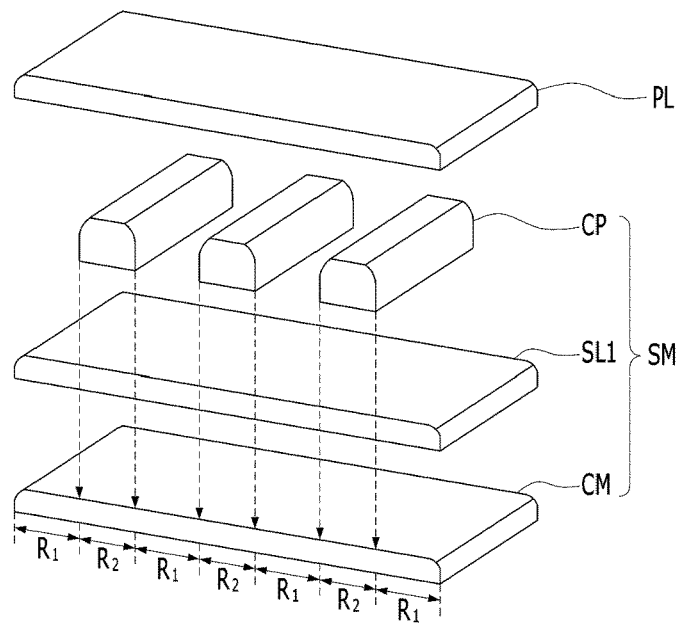
FIG. 1 is a perspective view schematically showing an electronic device in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations.

In presenting a specific example in a drawing or description having two or more layers in a multi-layer structure, the relative positioning relationship of such layers or the sequence of arranging the layers as presented reflects a particular implementation for the described or illustrated example. However, implementations may have different relative positioning relationships or different sequences of arranging the layers. In addition, a described or illustrated example of a multi-layer structure may not reflect all layers present in that particular multilayer structure. For example, one or more additional layers may be present between two illustrated layers. In a specific example, when a first layer in a described or illustrated multi-layer structure is referred to as being "on" or "over" a second layer, or "on" or "over" a substrate, the first layer may be directly disposed on the second layer or the substrate, or may be separated from the second layer or the substrate by one or more other intermediate layers.

FIG. 1 is a perspective view schematically showing an electronic device in accordance with an implementation of the present disclosure.

Referring to FIG. 1, the electronic device in accordance with the present implementation may include a semiconductor memory SM.

The semiconductor memory SM may include a cell mat CM, which includes a plurality of memory cells for storing data.

Also, the semiconductor memory SM may include various circuits for driving the semiconductor memory SM. The circuits may include, for example, one or more conductive patterns CP that are be spaced apart from the cell mat CM and that cross the cell mat CM over the cell mat CM. The conductive pattern CP may include a plurality of line shapes extending in a direction. The conductive pattern CP may be formed of a metal-containing material such as a metal, a metal nitride, and the like. However, the present implementation is not limited thereto, and the conductive pattern CP may have various shapes and be formed of various materials.

Although not shown, a contact plug may be coupled between the conductive pattern CP and another element, and may be disposed over and/or under the conductive pattern CP.

The conductive pattern CP may cover the whole cell mat CM. For example, the conductive pattern CP may overlap an entire surface of the cell mat CM. However, as shown in FIG. 1, the conductive pattern CP may cover a portion of the cell mat CM while exposing another portion of the cell mat CM. A region of the cell mat CM that is not covered by the conductive pattern CP may be referred to as a first region R1, and a region of the cell mat CM that is covered by the conductive pattern CP may be referred to as a second region R2. In other words, the first region R1 of the cell mat CM may not overlap the conductive pattern CP in a predetermined direction, and the second region R2 of the cell mat CM may overlap the conductive pattern CP in the predetermined direction. In the implementation shown in FIG. 1, the predetermined direction may be a vertical direction, such that the first region R1 does not vertically overlap the conductive pattern CP, and the second region R2 vertically overlaps the conductive pattern CP.

In FIG. 1, each of a plurality of first regions R1 has the same planar area, and each of a plurality of second regions R2 has the same planar area. However, other implementations are also possible. That is, the planar areas of the first regions R1 may be different from each other, and the planar areas of the second regions R2 may be different from each other. The term "planar area" may refer to a cross-section that is perpendicular to a specific direction, such as the vertical direction.

In addition, the semiconductor memory SM may include a shielding layer SL1 located between the cell mat CM and the conductive pattern CP. The shielding layer SL1 may be spaced apart from each of the cell mat CM and the conductive pattern CP. Also, the shielding layer SL1 may vertically overlap at least the first region R1 of the cell mat CM. An insulating material (not shown) such as a layer including a silicon oxide, a silicon nitride, and the like, may be disposed between the cell mat CM and the shielding layer SL1, and another insulating material may be disposed between the shielding layer SL1 and the conductive pattern CP. The reason why this shielding layer SL1 is required may be as follows.

The shielding layer SL1 may address a specific problem that arises after the semiconductor memory SM is fabricated. A passivation process for protecting the semiconductor memory SM from the outside may be performed by covering a surface of the semiconductor memory SM with a protective layer PL. The protective layer PL formed by the passivation process may be located over the semiconductor memory SM. However, without the shielding layer SL1, the first region R1 of the cell mat CM may receive a damage due to the plasma, that is, a Plasma-Induced Damage (PID) in the passivation process, while the second region R2 of the cell mat CM is not affected by the plasma. This is because the conductive pattern CP can block the plasma and thereby prevent the second region R2 of the cell mat CM from being affected by the plasma, but the insulating material cannot block the plasma, thereby exposing the first region R1 of the cell mat CM to the plasma. As a result, the memory cells disposed in the first region R1 of the cell mat CM may be damaged by the plasma, and thus the characteristics of the memory cells may be deteriorated. In an example, when the memory cells disposed in the cell mat CM include a variable resistance material such as a phase-change material, features of the memory cells of the first region R1 that have been damaged by the plasma, such as threshold voltages, reset currents, and the like, may be significantly different from the equivalent features of the memory cells of the second region R2, which have not been damaged by the plasma. Therefore, operation characteristics of the semiconductor memory SM may be deteriorated. That is, the performance of the semiconductor memory SM may deteriorate because features of the memory cells in the semiconductor memory SM, such as threshold voltages, reset currents, and the like, may be inconsistent across the semiconductor memory SM. On the other hand, when the shielding layer SL1 vertically overlaps at least the first region R1 of the cell mat CM and blocks the plasma, the first region R1 of the cell mat CM may not be damaged by the plasma.

The shielding layer SL1 may include a metallic material, which is capable of blocking the plasma. For example, the shielding layer SL1 may include a metal such as Ti, W, Al, Cu, Ta, or the like, a nitride of the metal, or a combination thereof. The shielding layer SL1 may include the same material as the conductive pattern CP so that the cost of fabricating the shielding layer SL1 may be reduced. The shielding layer SL1 may be electrically isolated from another element of the semiconductor memory SM. In other words, the shielding layer SL1 may have an isolated shape, and may be entirely surrounded by an insulating material. Accordingly, the shielding layer SL1 may be electrically disconnected from the cell mat CM, the conductive pattern CP, the contact plug coupled to the conductive pattern CP, etc.

In particular, in the present implementation, the shielding layer SL1 may have a plate shape, which overlaps the whole cell mat CM. The shielding layer SL1 has substantially the same planar area as the cell mat CM. In other words, the planar area of the shielding layer SL1 and the planar area of the cell mat CM may be completely the same or slightly different. In an example, the planar area of the shielding layer SL1 may be 0.9 to 1.1 times of the planar area of the cell mat CM. When the planar area of the shielding layer SL1 and the planar area of the cell mat CM are completely the same, a sidewall of the shielding layer SL1 may be aligned with a sidewall of the cell mat CM. When the planar area of the shielding layer SL1 and the planar area of the cell mat CM are substantially the same, an electrical short between the shielding layer SL1 and a conductive element adjacent to the shielding layer SL1 may be prevented. For example, an electrical short between the shielding layer SL1 and the contact plug, which is disposed under the conductive pattern CP and coupled to the conductive pattern CP, may be prevented when the shielding layer SL1 and the cell mat CM have the same planar area.

However, when the shielding layer SL1 covers the first region R1 of the cell mat CM, a shape and/or a planar area of the shielding layer SL1 may be variously modified. An example of this will be described with reference to FIG. 2.

Figure 2:
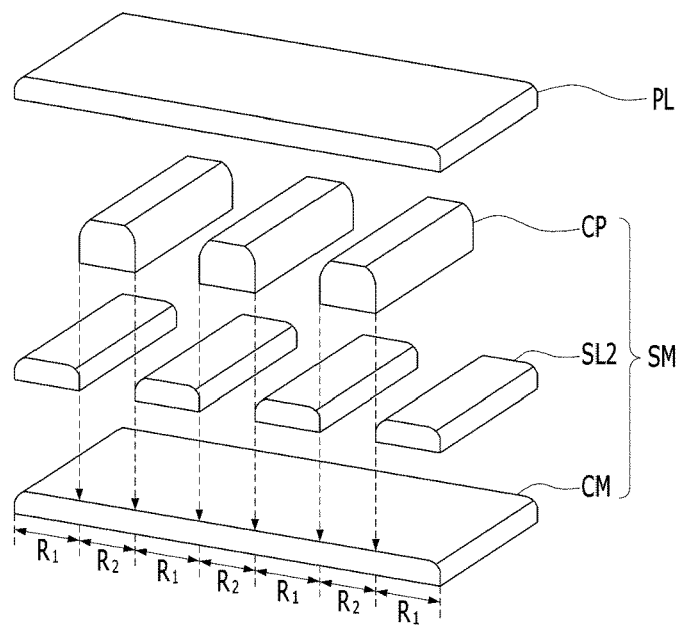
FIG. 2 is a perspective view schematically showing an electronic device in accordance with another implementation of the present disclosure.

FIG. 2 is a perspective view schematically showing an electronic device in accordance with another implementation of the present disclosure. Differences between the implementation of FIG. 2 and the implementation of FIG. 1 are described.

Referring to FIG. 2, the electronic device in accordance with the present implementation may include a semiconductor memory SM and a protective layer PL.

The semiconductor memory SM may include a cell mat CM, which includes a plurality of memory cells, a shielding layer SL2 disposed over the cell mat CM and spaced apart from the cell mat CM, and a conductive pattern CP disposed over the shielding layer SL2 and spaced apart from the shielding layer SL2.

The shielding layer SL2 may overlap a region of the cell mat CM in a predetermined direction that is not overlapped by the conductive pattern CP in the predetermined direction, and the predetermined direction may be a vertical direction. That is, the shielding layer SL2 may overlap a first region R1 of the cell mat CM when the conductive pattern CP may overlap a second region R2 of the cell mat CM. In other words, the shielding layer SL2 may overlap the cell mat CM and have a cross-section with a negative shape with respect to the conductive pattern CP. For example, when a plurality of line-shaped conductive patterns CP cross the cell mat CM, as shown in FIG. 2, a plurality of shielding layers SL2 may overlap the first region R1 of the cell mat CM and may be located between the conductive patterns CP. Therefore, the shielding layer SL2 may have a planar plate shape that is smaller than the shielding layer SL1 of FIG. 1. Each of the shielding layers SL2 may have substantially the same planar area as a corresponding first region R1 of the cell mat CM. When the planar areas of a plurality of first regions R1 are different from each other, the planar areas of the shielding layers SL2 may be different from each other.

Each of the shielding layers SL2 may be surrounded by an insulating material, which electrically insulates the shielding layers SL2 from other elements of the semiconductor memory SM. That is, the insulating material may be disposed, not only between the cell mat CM and the shielding layers SL2 as well as between the shielding layers SL2 and the conductive patterns CP, but also between the shielding layers SL2.

When the shielding layer SL2 of the present implementation has a relatively small planar area compared to the shielding layer SL1 of FIG. 1, bending of the semiconductor memory SM and/or a semiconductor chip due to stress may be reduced.

Figure 3A:
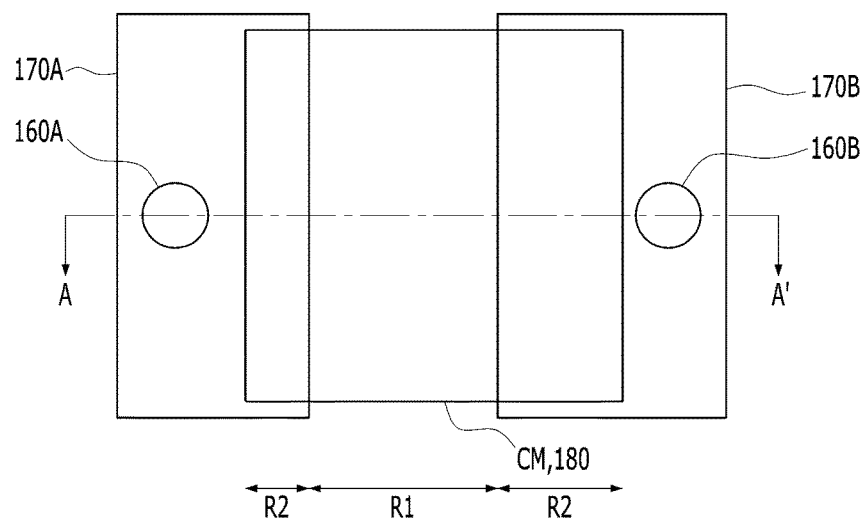
FIGS. 3A to 3D are views illustrating a semiconductor memory in accordance with an implementation of the present disclosure.
Figure 3B:
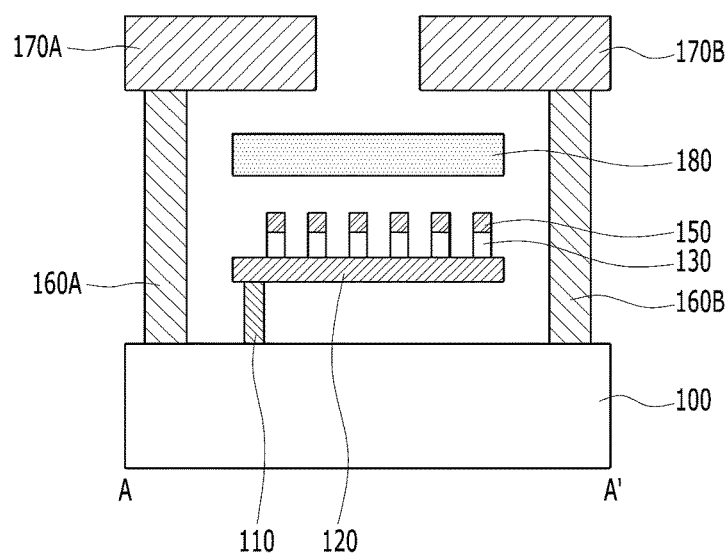
Figure 3C:
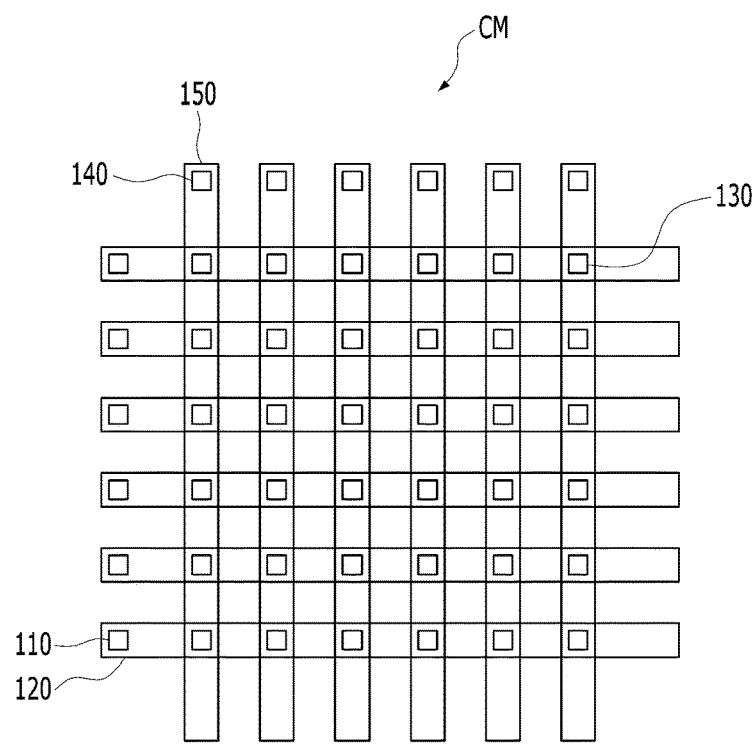
Figure 3D:
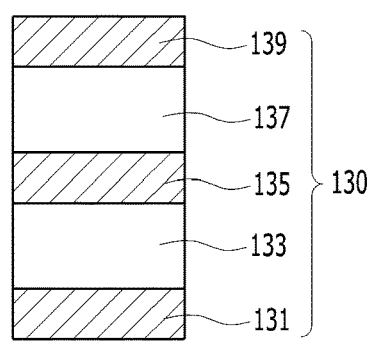

FIGS. 3A to 3D are views illustrating a semiconductor memory in accordance with an implementation of the present disclosure. FIG. 3A is a plan view schematically showing the semiconductor memory of the present implementation. FIG. 3B is a cross-sectional view showing the semiconductor memory of the present implementation in more detail along a line A-A' of FIG. 3A. FIG. 3C is a plan view showing a cell mat of the semiconductor memory of the present implementation in more detail. FIG. 3D is a cross-sectional view showing an example of a memory cell of FIGS. 3B and 3C.

Referring to FIGS. 3A to 3C, the semiconductor memory of the present implementation may include a substrate 100, a cell mat CM disposed over the substrate 100, a shielding layer 180 disposed over the cell mat CM, and conductive patterns 170A and 170B disposed over the shielding layer 180. The conductive patterns 170A may partially overlap the cell mat CM in a predetermined direction. The predetermined direction may be a vertical direction.

The substrate 100 may include a lower structure (not shown). For example, the substrate 100 may include a circuit for driving the cell mat CM, the conductive patterns 170A and 170B, and the like. The circuit may include a transistor.

The cell mat CM may have a cross-point structure in which a plurality of memory cells 130 are located between lower lines and upper lines, where the lower lines cross the upper lines. Specifically, the cell mat CM may include first lines 120 extending in a first direction, second lines 150 located over the first lines 120 and extending in a second direction crossing the first direction, and the memory cells 130 disposed between the first lines 120 and the second lines 150. The first direction may be parallel to the line A-A', and the second direction may be substantially perpendicular to the line A-A'. The memory cells 130 may overlap intersection regions between the first lines 120 and the second lines 150 in a third direction crossing the first direction and the second direction.

A first contact plug 110 may be disposed under the first line 120 and may be coupled between the first line 120 and a portion of the substrate 100. For example, the first contact plug 110 may couple the first line 120 to a junction region of a transistor (not shown) disposed in the substrate 100.

A second contact plug 140 may be disposed under the second line 150 and may be coupled between the second line 150 and another portion of the substrate 100. For example, the second contact plug 140 may couple the second line 150 to a junction region of a transistor (not shown) disposed in the substrate 100.

When the cell mat CM has the cross-point structure, circuits for controlling the first lines 120 and the second lines 150 of the cell mat CM may be located under the cell mat CM, for example, within the substrate 100. Therefore, an upper space of the cell mat CM, which may be above the cell mat CM, may not be used.

The memory cell 130 may have various materials and/or structures for storing data. In an example, the memory cell 130 may include a variable resistance material that switches between different resistance states according to a voltage or current applied to its upper end and lower end through the first line 120 and the second line 150. An example of the variable resistance material will be described with reference to FIG. 3D.

Referring to FIG. 3D, the memory cell 130 may include a lower electrode layer 131, a selection element layer 133, a middle electrode layer 135, a variable resistance layer 137, and an upper electrode layer 139, which are sequentially stacked.

The lower electrode layer 131 may be located at the lowermost portion of the memory cell 130, and may function as a transmission path for a voltage or current from the first line 120. The middle electrode layer 135 may physically separate the selection element layer 133 and the variable resistance layer 137 from each other, and may electrically couple the selection element layer 133 and the variable resistance layer 137 with each other. The upper electrode layer 139 may be located at the uppermost portion of the memory cell 130, and may function as a transmission path of a voltage or current from the second line 150. The lower electrode layer 131, the middle electrode layer 135, and the upper electrode layer 139 may each have a single-layered structure or multi-layered structure, and may each include one or more of various conductive materials such as a metal, a metal nitride, a conductive carbon material, etc. In implementations, at least one of the lower electrode layer 131, the middle electrode layer 135, and the upper electrode layer 139 may be omitted.

The variable resistance layer 137 may have a variable resistance characteristic. That is, the variable resistance layer 137 may switch between different resistance states according to a voltage or current applied through upper and lower ends of the variable resistance layer 137. Data may be stored in the variable resistance layer 137 according to a resistance state of the variable resistance layer 137. For example, when the variable resistance layer 137 is in a low resistance state, a data of '1' may be stored in the memory cell 130. On the other hand, when the variable resistance layer 137 is in a high resistance state, a data of '0' may be stored in the memory cell 130. The variable resistance layer 137 may include a material used in an RRAM, a PRAM, an FRAM, or an MRAM. For example, the material may include a metal oxide such as a transition metal oxide or a perovskite-based material, a phase-change material such as a chalcogenide-based material, a ferroelectric material, a ferromagnetic material, or the like. The variable resistance layer 137 may have a single-layered structure, or a multi-layered structure that exhibits the variable resistance characteristic using a combination of more than two layers.

The selection element layer 133 may control access to the variable resistance layer 137. The selection element layer 133 may have a selection element characteristic. That is, a current flow through the selection element layer 133 may be substantially blocked when a level of a voltage or current applied to the selection element layer 133 is equal to or lower than a certain threshold value, and a current flow through the selection element layer 133 may sharply increase in proportion to a magnitude of the applied voltage or current when the level of the applied voltage or current is higher than the certain threshold value. The selection element layer 133 may include a Metal-Insulator-Transition (MIT) element such as $NbO_2$ or $TiO_2$, a Mixed Ion-Electron Conducting (MIEC) element such as $ZrO_2(Y_2O_3)$, $Bi_2O_3$—BaO, or $(La_2O_3)x(CeO_2)1-x$, an Ovonic Threshold Switching (OTS) element including a chalcogenide-based material such as $Ge_2Sb_2Te_5$, $As_2Te_3$, $As_2$, or $As_2Se_3$, or a tunneling insulating layer. The tunneling insulating layer may include a thin film, which may include an insulating material such as a silicon oxide, a silicon nitride, a metal oxide, or the like. The thin film may allow tunneling of electrons when a certain voltage or current is applied to the thin film. The selection element layer 133 may have a single-layered structure, or a multi-layered structure that exhibits the selection element characteristic using a combination of more than two layers. In implementations, the selection element layer 133 may be omitted.

Locations of the selection element layer 133 and the variable resistance layer 137 may be reversed with each other. That is, the selection element layer 133 may be located between the middle electrode layer 135 and the upper electrode layer 139, and the variable resistance layer 137 may be located between the middle electrode layer 135 and the lower electrode layer 131.

Referring again to FIGS. 3A to 3C, the shielding layer 180 may be disposed over the cell mat CM, and may be spaced apart from the cell mat CM. An insulating material (not shown) may be interposed between the shielding layer 180 and the cell mat CM. Accordingly, the shielding layer 180 may be electrically isolated from the cell mat CM.

The shielding layer 180 may have a single-layered structure or multi-layered structure. The shielding layer 180 may include a metallic material that is capable of blocking plasma. Also, in the present implementation, the shielding layer 180 may overlap the cell mat CM, and have substantially the same planar area as the cell mat CM. Accordingly, a whole surface of the cell mat CM may be vertically covered with the shielding layer 180.

The conductive patterns 170A and 170B may include a first conductive pattern 170A, which overlaps a left portion of the cell mat CM in the third direction, and a second conductive pattern 170B, which overlaps a right portion of the cell mat CM in the third direction. An opening or gap between the first conductive pattern 170A and the second conductive pattern 170B may overlap a center portion of the cell mat CM in the third direction, but may not overlap the left portion and the right portion of the cell mat CM in the third direction. That is, the gap may expose the center portion of the cell mat CM in the third direction, and may not expose the left portion and the right portion of the cell mat CM. In the present implementation, the first conductive pattern 170A and the second conductive pattern 170B may be located at the same height from the substrate 100. However, in another implementation, the first conductive pattern 170A and the second conductive pattern 170B may be located at different heights from the substrate 100. Also, the number and/or the shape of the conductive patterns 170A and 170B may be variously changed. The conductive patterns 170A and 170B may have a single-layered structure or multi-layered structure, and may include a metallic material that is capable of blocking plasma.

A third contact plug 160A may be disposed under the first conductive pattern 170A and may be coupled between the first conductive pattern 170A and a portion of the substrate 100. For example, the third contact plug 160A may couple the first conductive pattern 170A to a junction region of a transistor (not shown) disposed in the substrate 100.

A fourth contact plug 160B may be disposed under the second conductive pattern 170B and may be coupled between the second conductive pattern 170B and a portion of the substrate 100. For example, the fourth contact plug 160B may couple the second conductive pattern 170B to a junction region of a transistor (not shown) disposed in the substrate 100.

The third and fourth contact plugs 160A and 160B may be laterally spaced apart from the cell mat CM. Therefore, the third and fourth contact plugs 160A and 160B may be electrically isolated from the cell mat CM and the shielding layer 180.

In the present implementation, the shielding layer 180 has one planar plate shape which has substantially the same planar area as the cell mat CM. However, when the shielding layer 180 covers a region of the cell mat CM that does not overlap the conductive patterns 170A and 170B in the third direction, the shape of the shielding layer 180 may be variously changed. For example, similar to the implementations described with reference to FIG. 2, a top surface of the shielding layer 180 may be fully exposed by the gap between the conductive patterns 170A and 170B in the third direction. The shielding layer 180 may overlap the cell mat CM. In an implementation, the shielding layer 180 may have substantially the same planar area as the gap between the conductive patterns 170A and 170B.

Figure 4A:
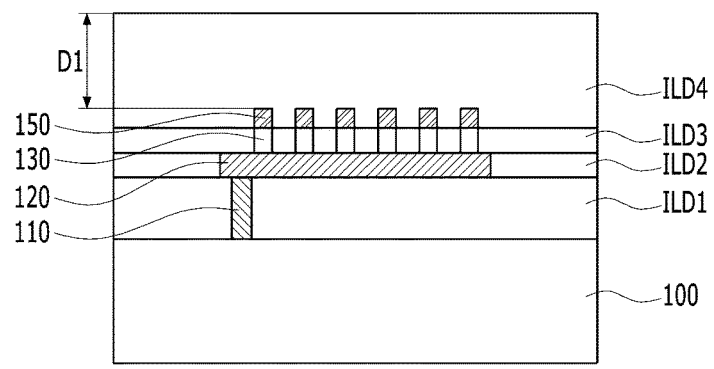
FIGS. 4A to 4C are cross-sectional views illustrating an example of a method for fabricating the semiconductor memory of FIGS. 3A to 3C.
Figure 4B:
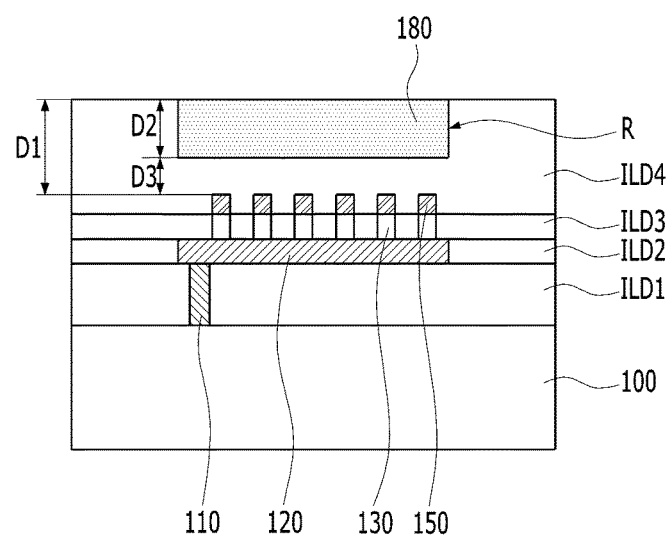
Figure 4C:
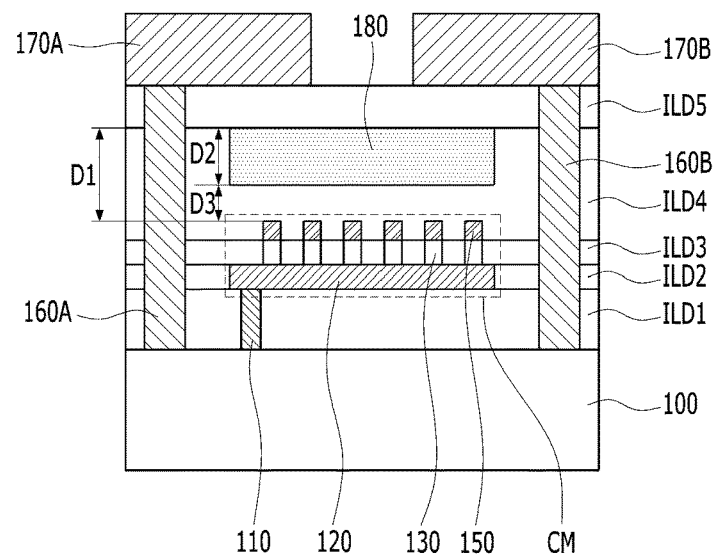

FIGS. 4A to 4C are cross-sectional views illustrating an example of a method for fabricating the semiconductor memory of FIGS. 3A to 3D.

Referring to FIG. 4A, a cell mat CM having a cross-point structure may be disposed over a substrate 100.

Specifically, a first interlayer insulating layer ILD1 may be formed over the substrate 100. Then, first contact plugs 110 penetrating through the first interlayer insulating layer ILD1 and coupled to portions of the substrate 100 may be formed.

A conductive material may be deposited over the first interlayer insulating layer ILD1 and the first contact plugs 110, and may be selectively etched to form first lines 120. The first lines 120 may extend in a first direction and may be coupled to upper ends of the first contact plugs 110. A space between the first lines 120 may be filled with a second interlayer insulating layer ILD2.

Then, material layers may be sequentially deposited over the second interlayer insulating layer ILD2 and the first lines 120. The material layers may include, for example, a lower electrode material, a selection element material, a middle electrode material, a variable resistance material, and an upper electrode material. The material layers may be selectively etched to form memory cells 130, which are coupled to the first lines 120 and arranged in a matrix form across a horizontal plane. Each of the memory cells 130 may include, for example, a lower electrode, a selection element, a middle electrode, a variable resistor, and an upper electrode. A space between the memory cells 130 may be filled with a third interlayer insulating layer ILD3.

Then, although not shown, second contact plugs 140 may be formed. The second contact plugs 140 may penetrate through the first to third interlayer insulating layers ILD1, ILD2, and ILD3, and may be coupled to portions of the substrate 100.

Then, a conductive material may be deposited over the third interlayer insulating layer ILD3, the memory cells 130, and the second contact plugs 140, and may be selectively etched to form second lines 150. The second lines 150 may extend in a second direction crossing the first direction, and may be coupled to upper ends of the memory cells 130 and the second contact plugs 140. Accordingly, the cell mat CM may be formed.

Then, a fourth interlayer insulating layer ILD4 may be formed over the cell mat CM. Here, the fourth interlayer insulating layer ILD4 may fill a space between the second lines 150. An upper surface of the fourth interlayer insulating layer ILD4 may be higher than upper surfaces of the second lines 150 by a predetermined distance. That is, the fourth interlayer insulating layer ILD4 may have a predetermined thickness D1 above the upper surfaces of the second lines 150. A total thickness of the fourth interlayer insulating layer ILD4 may be modified in consideration of a depth of a recess and/or a thickness of a shielding layer which will be described later.

Referring to FIG. 4B, the fourth interlayer insulating layer ILD4 may be selectively etched to form a recess R having a predetermined depth D2. The recess R may include a space in which a shielding layer 180 is to be formed. The depth D2 of the recess R may be modified so that the shielding layer 180 has a thickness that is sufficient to shield or block plasma. Furthermore, the depth D2 of the recess R may be smaller than the distance D1 between the upper surface of the fourth interlayer insulating layer ILD4 and the upper surfaces of the second lines 150. In other words, the fourth interlayer insulating layer ILD4 may be selectively etched such that the upper surfaces of the second lines 150 are not exposed. The etched fourth interlayer insulating layer ILD4 may remain over the second lines 150 in a predetermined thickness D3. Accordingly, an electrical short between the shielding layer 180 and the second lines 150 may be prevented.

In the present implementation, the recess R may overlap the cell mat CM in a predetermined direction. A cross-section of the recess R may have substantially the same planar area as the cell mat CM. For example, the recess R may fully overlap the cell mat CM in a vertical direction.

Then, a metallic material may be formed over the fourth interlayer insulating layer ILD4, and may have a thickness sufficient to fill the recess R. The shielding layer 180 may be formed by performing a planarization process, for example, a Chemical Mechanical Polishing (CMP) process, on the metallic material until the upper surface of the fourth interlayer insulating layer ILD4 is exposed. The shielding layer 180 fills the recess R.

According to the shape of the recess R of the present implementation, the shielding layer 180 may overlap the cell mat CM in the predetermined direction and have a cross-section with substantially the same planar area as the cell mat CM.

However, similar to the implementations described with reference to FIG. 2, the shielding layer 180 overlaps a gap between conductive patterns 170A and 170B in the predetermined direction, which will be described later, and has substantially the same planar area as the gap. In other words, the shielding layer 180 may have a cross-section with a negative shape with respect to the conductive patterns 170A and 170B. If the planar area of the shielding layer 180 is relatively small, a dishing phenomenon, in which an edge of an upper surface of the shielding layer 180 is recessed further than a center portion of the upper surface of the shielding layer 180 during the planarization process, may be reduced and/or prevented. Accordingly, the shielding layer 180 may have a relatively uniform thickness through the edge and the center portion, and thus subsequent processes in the method may be easily completed.

Referring to FIG. 4C, a fifth interlayer insulating layer ILD5 may be formed over the fourth interlayer insulating layer ILD4 and the shielding layer 180.

Then, third and fourth contact plugs 160A and 160B may be formed. The third and fourth contact plugs 160A and 160B may penetrate through the first to fifth interlayer insulating layers ILD1, ILD2, ILD3, ILD4, and ILD5, and may be coupled to portions of the substrate 100. The third and fourth contact plugs 160A and 160B may be spaced apart from the cell mat CM and the shielding layer 180. The cell mat CM includes the first lines 120, the memory cells 130, and the second lines 150.

Then, a conductive material may be deposited over the fifth interlayer insulating layer ILD5 and the third and fourth contact plugs 160A and 160B, and may be selectively etched to form first and second conductive patterns 170A and 170B, which are coupled to upper ends of the third and fourth contact plugs 160A and 160B, respectively.

In the above processes, the shielding layer 180 is formed by etching a space in the fourth interlayer insulating layer ILD4 and filling the etched space with a conductive material. However, in another implementation, the shielding layer 180 may be formed by directly etching a conductive material. An example of this will be described with reference to FIG. 5.

Figure 5:
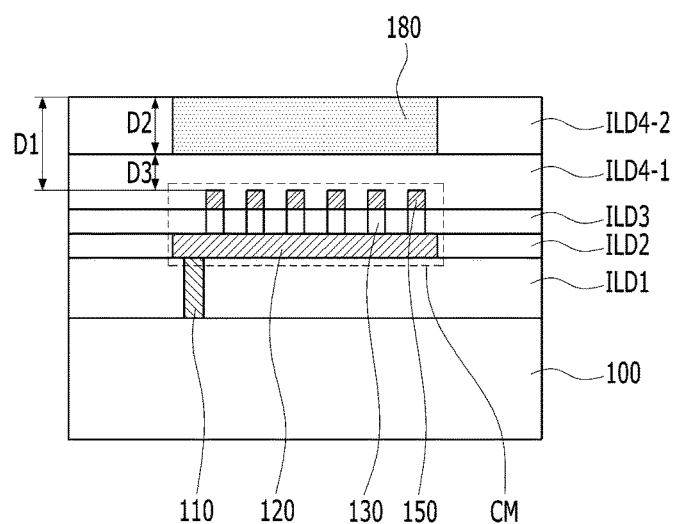
FIG. 5 is a cross-sectional view illustrating another example of a method for fabricating the semiconductor memory of FIGS. 3A to 3C.

FIG. 5 is a cross-sectional view illustrating another example of a method for fabricating the semiconductor memory of FIGS. 3A to 3C. Differences between the implementation of FIG. 5 and the implementation of FIGS. 4A to 4C are described.

Referring to FIG. 5, a cell mat CM may be disposed over a substrate 100. The cell mate CM may include first lines 120, memory cells 130, and second lines 150.

Then, a first portion ILD4-1 of a fourth interlayer insulating layer ILD4 may be formed over the cell mat CM. The first portion ILD4-1 may fill a space between the second lines 150 and have an upper surface that is higher than upper surfaces of the second lines 150 by a predetermined thickness D3.

Then, a metallic material may be deposited over the first portion ILD4-1 and selectively etched to form a shielding layer 180. A thickness of the shielding layer 180 may correspond to 'D2' of the aforementioned implementation.

Then, an insulating material covering the shielding layer 180 may be formed. A planarization process may be performed on the insulating material until an upper surface of the shielding layer 180 is exposed. The planarized insulating material forms a second portion ILD4-2 of the fourth interlayer insulating layer ILD4. The second portion ILD4-2 may fill a space around the shielding layer 180, and may have an upper surface with the same height as the upper surface of the shielding layer 180.

Subsequent processes may be substantially the same as those described with reference to FIG. 4C, and thus detailed descriptions thereof will be omitted.

By the aforementioned electronic device and fabricating method, a shielding layer can protect a cell mat from plasma when the electronic device is subjected to a passivation process. Therefore, a deterioration of characteristics of memory cells in the electronic device due to the passivation process may be prevented.

The above and other memory circuits or semiconductor devices based on implementations of the disclosed technology can be used in a range of devices or systems. FIGS. 6-10 provide some examples of devices or systems that can implement the memory circuits disclosed herein.

Figure 6:
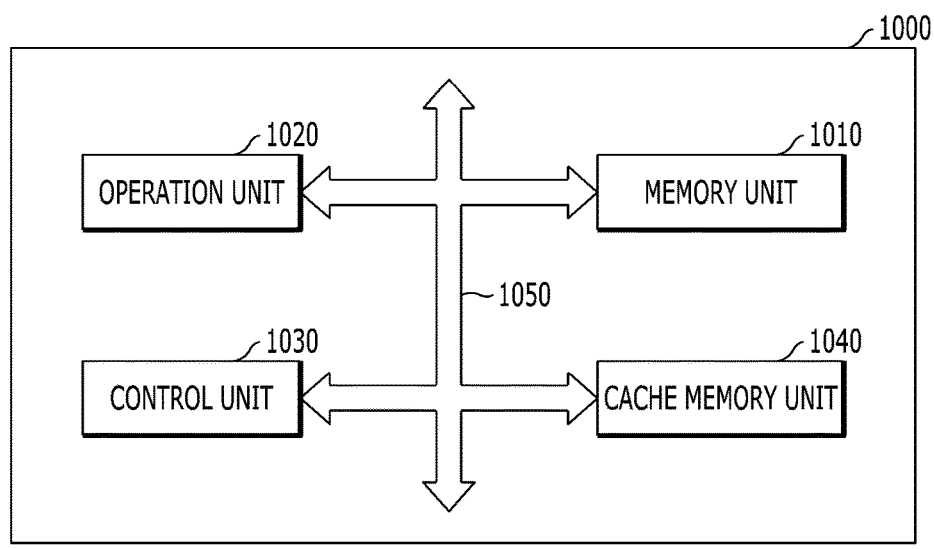
FIG. 6 is an example of a configuration diagram of a microprocessor implementing memory circuitry based on an implementation of the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the memory unit 1010 may be prevented. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
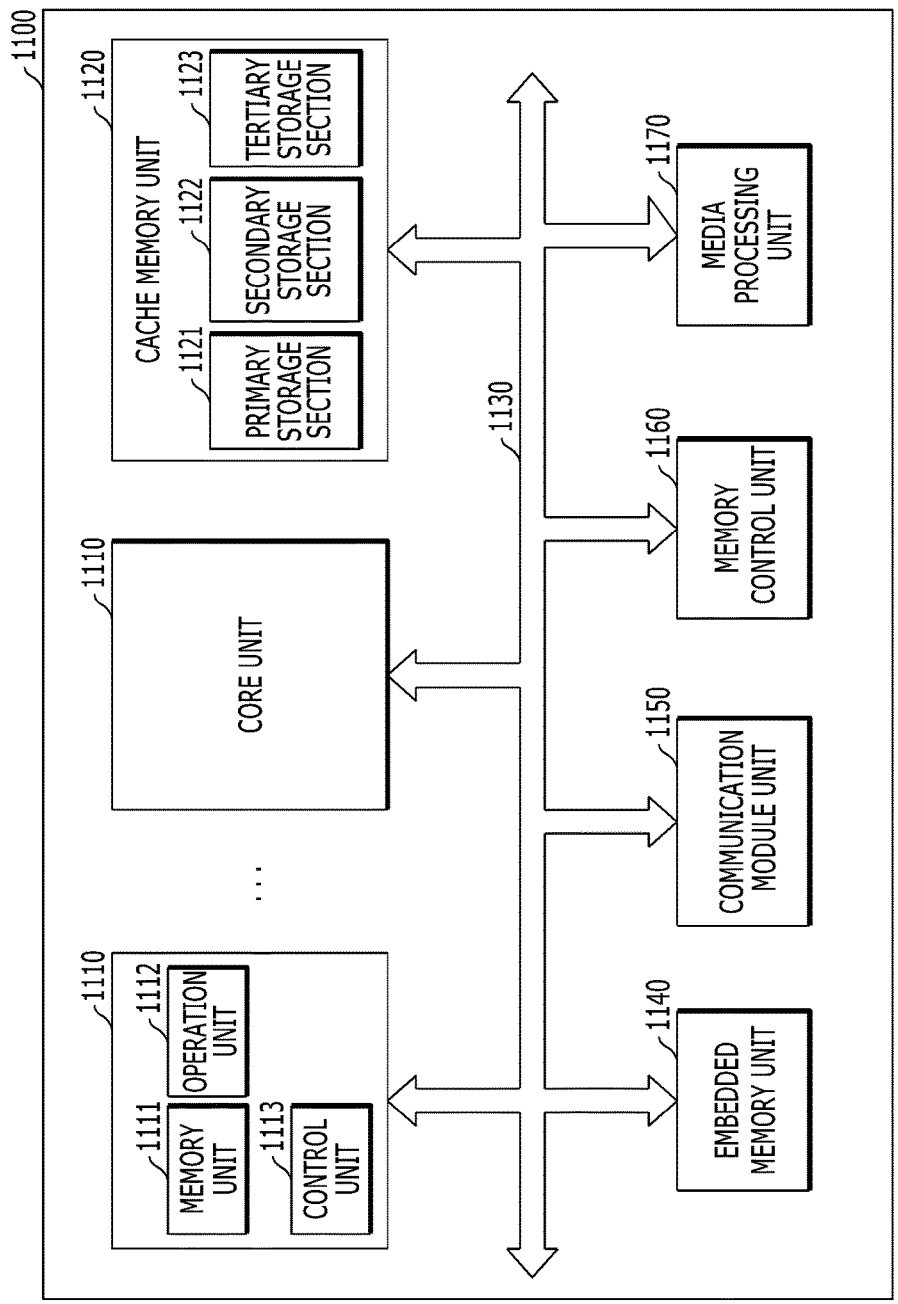
FIG. 7 is an example of a configuration diagram of a processor implementing memory circuitry based on an implementation of the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the cache memory unit 1120 may be prevented. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
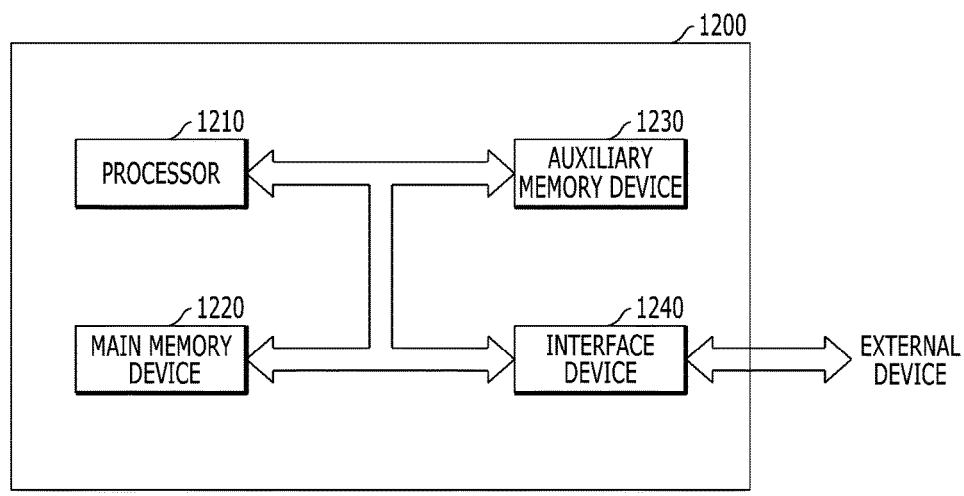
FIG. 8 is an example of a configuration diagram of a system implementing memory circuitry based on an implementation of the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the main memory device 1220 may be prevented. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the auxiliary memory device 1230 may be prevented. As a consequence, operating characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
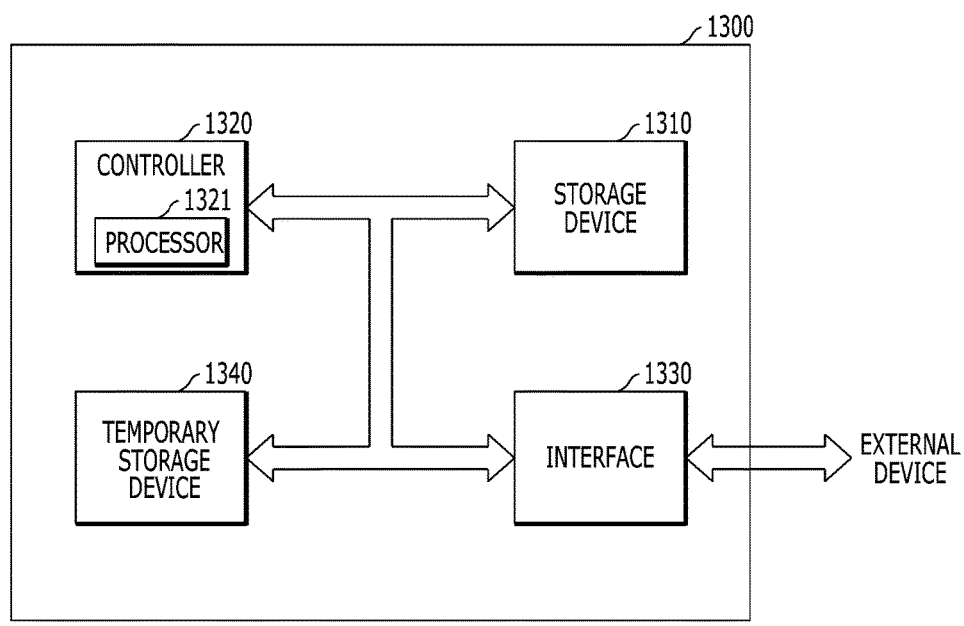
FIG. 9 is an example of a configuration diagram of a data storage system implementing memory circuitry based on an implementation of the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the storage device 1310 or the temporary storage device 1340 may be prevented. As a consequence, operating characteristics and data storage characteristics of the data storage system 1300 may be improved.

Figure 10:
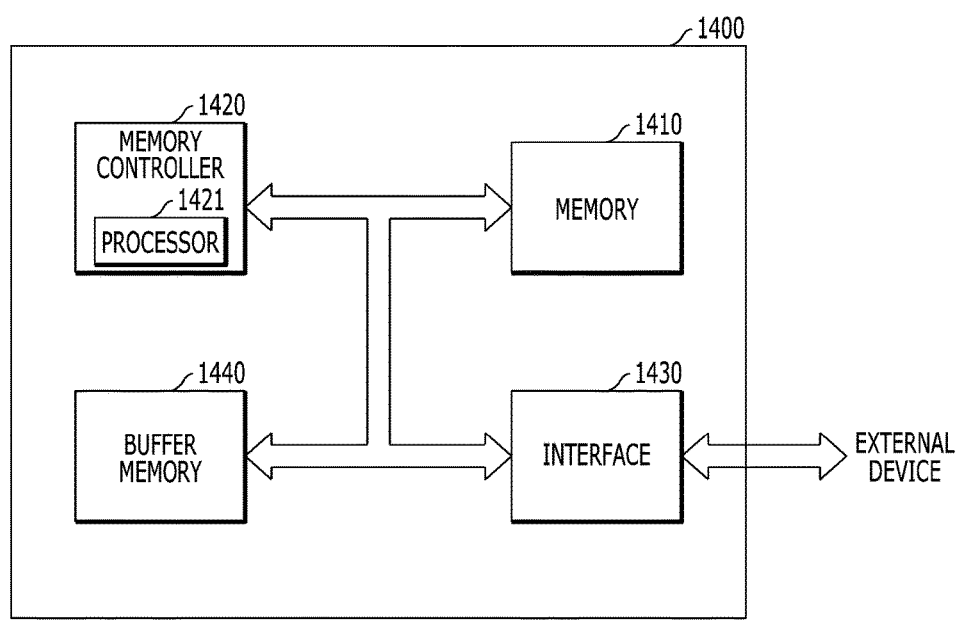
FIG. 10 is an example of a configuration diagram of a memory system implementing memory circuitry based on an implementation of the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the memory 1410 may be prevented. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a cell mat disposed over a substrate, the cell mat including a plurality of memory cells; an insulating layer disposed over the cell mat; a conductive pattern disposed over the insulating layer, the conductive pattern overlapping a first portion of the cell mat without overlapping a second portion of the cell mat; and a shielding layer disposed in the insulating layer, the shielding layer overlapping at least the second portion of the cell mat, the shielding layer being capable of blocking plasma. Through this, deterioration of characteristics of memory cells of the buffer memory 1440 may be prevented. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these specifics should not be construed as limitations on the scope of any invention or of what may be claimed, but rather as descriptions of features that may be specific to particular embodiments of the disclosure. Certain features that are described in this patent document in the context of separate embodiments can also be implemented in combination. In addition, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, wherein the semiconductor memory comprises:
   a cell mat disposed over a substrate;
   an insulating layer disposed over the cell mat;
   a conductive pattern disposed over the insulating layer, the conductive pattern overlapping a first portion of the cell mat without overlapping a second portion of the cell mat; and
   a shielding layer disposed in the insulating layer, the shielding layer overlapping at least the second portion of the cell mat, the shielding layer being capable of blocking plasma,
   wherein the cell mat includes:
      a plurality of first lines extending in a first direction;
      a plurality of second lines extending in a second direction crossing the first direction; and
      a plurality of memory cells located at intersections between the first lines and the second lines, and
   wherein the shielding layer has the same planar area as the cell mat to cover the plurality of memory cells.

2. The electronic device according to claim 1, wherein the shielding layer is entirely surrounded by the insulating layer.

3. The electronic device according to claim 1, wherein the shielding layer is electrically isolated from the cell mat and the conductive pattern.

4. The electronic device according to claim 1, wherein the shielding layer includes a metal, a metal nitride, or both.

5. The electronic device according to claim 1, wherein the shielding layer and the conductive pattern include the same material.

6. The electronic device according to claim 1, further comprising:
   a protective layer disposed over the semiconductor memory.

7. The electronic device according to claim 1, wherein the semiconductor memory further comprises:
   a contact plug disposed under the conductive pattern, the contact plug connecting the conductive pattern with the substrate,
   wherein the contact plug is located outside of the cell mat.

8. The electronic device according to claim 7, wherein the shielding layer is electrically insulated from the contact plug.

9. The electronic device according to claim 1, wherein each of the memory cells includes a variable resistance layer, a resistance of the variable resistance layer switching between different resistance states according to a voltage or current applied through the first lines and the second lines.

10. The electronic device according to claim 1, further comprising a microprocessor which includes:
   a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

11. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

12. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and an outside,
   wherein the semiconductor memory is part of the auxiliary memory device or the main memory device in the processing system.

13. The electronic device according to claim 1, further comprising a data storage system which includes:
   a storage device configured to store data and conserve stored data regardless of power supply;
   a controller configured to control input and output of data to and from the storage device according to a command inputted from an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

14. The electronic device according to claim 1, further comprising a memory system which includes:
   a memory configured to store data and conserve stored data regardless of power supply;
   a memory controller configured to control input and output of data to and from the memory according to a command inputted from an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

15. An electronic device including a semiconductor memory, wherein the semiconductor memory comprises:
   a cell mat disposed over a substrate;
   an insulating layer disposed over the cell mat;
   a conductive pattern disposed over the insulating layer, the conductive pattern overlapping a first portion of the cell mat without overlapping a second portion of the cell mat; and
   a shielding layer disposed in the insulating layer, the shielding layer overlapping the second portion of the cell mat without overlapping the first portion of the cell mat,
   wherein the cell mat includes:
      a plurality of first lines extending in a first direction;
      a plurality of second lines extending in a second direction crossing the first direction; and
      a plurality of memory cells located at intersections between the first lines and the second lines, and
   wherein the shielding layer has the same planar area as the second portion of the cell mat.

16. An electronic device including a semiconductor memory, wherein the semiconductor memory comprises:
   a cell mat over a substrate;
   a conductive shielding layer over the cell mat;
   conductive patterns over the shielding layer; and
   outside contact plugs located at outside of the cell mat, the outside contact plugs being connected to the conductive patterns,
   wherein the cell mat comprises:
      first lines extending in a first direction;
      second lines extending in a second direction crossing the first direction;
      a plurality of memory cells at intersections between the first lines and the second lines;
      first contact plugs between the substrate and the first lines to connect the substrate to the first lines; and
      second contact plugs between the substrate and the second lines to connect the substrate to the second lines, and
   wherein the shielding layer overlaps the cell mat to cover the plurality of memory cells.

17. The electronic device according to claim 16, further comprising:
   a first transistor on the substrate, the first transistor having a first junction region connected to a first contact plug; and
   a second transistor on the substrate, the second transistor having a second junction region connected to a second contact plug.

18. The electronic device according to claim 16, wherein the shielding layer has a plurality of planar plates that are alternately disposed with the conductive patterns in a top view.

19. The electronic device according to claim 16, wherein the outside contact plugs connect the conductive patterns to the substrate.

20. The electronic device according to claim 16, wherein sidewalls of the cell mat and the shielding layer are aligned with each other.

* * * * *